(12) United States Patent
Chen et al.

(10) Patent No.: US 10,211,142 B1
(45) Date of Patent: Feb. 19, 2019

(54) CHIP-ON-FILM PACKAGE STRUCTURE

(71) Applicant: ChipMOS Technologies Inc., Hsinchu (TW)

(72) Inventors: Pi-Chang Chen, Hsinchu (TW); Yong-Fang Chiang, Hsinchu (TW)

(73) Assignee: ChipMOS Technologies Inc., Hsinchu (TW)

( * ) Notice: Subject to any disclaimer, the term of this patent is extended or adjusted under 35 U.S.C. 154(b) by 0 days.

(21) Appl. No.: 15/886,851

(22) Filed: Feb. 2, 2018

(30) Foreign Application Priority Data

Sep. 11, 2017 (TW) .............................. 106130986 A

(51) Int. Cl.
*H01L 23/498* (2006.01)
*H01L 23/00* (2006.01)

(52) U.S. Cl.
CPC .... *H01L 23/49838* (2013.01); *H01L 23/4985* (2013.01); *H01L 23/49811* (2013.01); *H01L 23/49827* (2013.01); *H01L 24/16* (2013.01); *H01L 24/17* (2013.01); *H01L 2224/16227* (2013.01); *H01L 2224/17152* (2013.01)

(58) Field of Classification Search
CPC ......... H01L 23/49838; H01L 23/49844; H01L 23/49827; H01L 23/49811; H01L 23/4985; H01L 23/5226; H01L 24/16; H01L 24/17; H01L 2224/16227; H01L 2224/17152
See application file for complete search history.

(56) References Cited

U.S. PATENT DOCUMENTS

| | | | | |
|---|---|---|---|---|
| 6,509,631 B2* | 1/2003 | Toyosawa | ........... | H01L 23/3107 257/668 |
| 2004/0242027 A1* | 12/2004 | Tanokura | ................ | H01L 24/06 439/60 |
| 2013/0248863 A1* | 9/2013 | Tang | ....................... | H01L 22/30 257/48 |
| 2017/0092572 A1* | 3/2017 | Cheng | ..................... | H01L 22/32 |

* cited by examiner

*Primary Examiner* — Thanh Y Tran
(74) *Attorney, Agent, or Firm* — JCIPRNET

(57) ABSTRACT

A COF package structure includes a flexible substrate and a chip. A chip mounting area is defined on an upper surface of a flexible base of the flexible substrate. A circuit layer of the flexible substrate includes a plurality of first upper leads, second upper leads, first conductive vias and lower leads. The second upper leads are disposed in the chip mounting area and divided into groups, and each second upper lead has a second inner end and an upper pad opposite to each other. The upper pads of each group are arranged layer by layer into at least two rows. There are two upper pads symmetrically arranged on both sides of a reference line of each group on at least one row furthest from the second inner ends. The first conductive vias connect the upper pads and the lower leads. The chip is mounted in the chip mounting area.

10 Claims, 6 Drawing Sheets

CHIP-ON-FILM PACKAGE STRUCTURE

CROSS-REFERENCE TO RELATED APPLICATION

This application claims the priority benefit of Taiwan application serial no. 106130986, filed on Sep. 11, 2017. The entirety of the above-mentioned patent application is hereby incorporated by reference herein and made a part of this specification.

BACKGROUND OF THE INVENTION

Field of the Invention

The invention relates to a chip package structure and more particularly, to a chip-on-film (COF) package structure.

Description of Related Art

Along with improvement of the semiconductor technology, liquid crystal displays (LCDs) have advantages in low power consumption, thinness and lightness, high resolution, high color saturation, long lifespan and so on, and therefore have been widely applied in electronic products closely linked with daily life, such as LCDs of mobile phones, notebook or desktop computers and LCD TV sets. Therein, a driver IC is definitely an indispensable and important component. In order to satisfy various application demands of the LCD driver ICs, a tape automatic bonding (TAB) packaging technique is generally used, and a chip-on-film (COF) package structure is one of the package structures applying the TAB technique.

As more and more functions of the electronic products are demanded, the integrated circuit density of a chip keeps increasing, and the amount of leads on a flexible substrate of a COF package structure must also be increased accordingly. It causes increased difficulty in lead layout on the single-sided flexible substrates which have been widely used. Thus, design of the flexible substrates starts to lean to the double-sided circuit design. At present, leads on a double-sided flexible substrate mostly extend outward from a chip mounting area on an upper surface of the flexible substrate, and are then directed to leads on a lower surface through conductive vias at an area outside the chip mounting area. Generally, the amount of bumps on the output side of the driver IC is extremely large, and the large amount of leads are correspondingly connected with the bumps on the output side and extend from the chip mounting area toward the outer edge of the flexible substrate by passing through an edge of the chip. However, due to the limitations of the chip size, the lead width and pitches, the amount of leads capable of passing through an edge of the chip is limited so that the amount of bumps on the output side of the chip can hardly increase. Moreover, the conductive vias disposed outside the chip mounting area occupy the area that the leads can be distributed on, therefore reducing the degree of freedom for lead layout on the flexible substrate.

SUMMARY OF THE INVENTION

The invention provides a chip-on-film (COF) package structure capable of significantly increasing the number of leads and effectively reducing pitches of the leads by arranging the upper pads correspondingly connected with the conductive vias in a multi-row manner.

A COF package structure of the invention includes a flexible substrate and a chip. The flexible substrate includes a flexible base and a circuit layer. The flexible base has an upper surface and a lower surface opposite to each other. A chip mounting area having a first side and a second side opposite to each other is defined on the upper surface. The circuit layer includes a plurality of first upper leads, a plurality of second upper leads, a plurality of first conductive vias and a plurality of lower leads. The first upper leads and the second upper leads are located on the upper surface, each of the first upper leads has a first inner end, the first inner ends are located in the chip mounting area and are close to the first side, and each of the first upper leads extends from the first inner end into a direction away from the chip mounting area. The second upper leads are disposed in the chip mounting area. Each of the second upper leads has a second inner end and an upper pad opposite to each other, the second inner ends are close to the first side and located further from the first side than the first inner ends, and each of the second upper leads extends from the second inner end in a direction toward the second side to connect with one of the upper pads. A width of each of the upper pads is greater than that of the other parts of the corresponding second upper lead. The second upper leads are divided into a plurality of groups, wherein the upper pads of each of the groups are arranged layer by layer into at least two rows in a direction from positions close to the second inner ends toward the second side, and there are two upper pads symmetrically arranged on both sides of a reference line of each of the groups on at least one row furthest from the second inner ends, wherein the reference line is close to or overlaps a center line of each of the groups. The first conductive vias penetrate the flexible base, and are located in the chip mounting area and correspondingly connected with the upper pads respectively. The lower leads are located on the lower surface and electrically connected with the second upper leads through the first conductive vias. The chip has a first edge and a second edge opposite to each other, and includes a plurality of first bumps and a plurality of second bumps close to the first edge. The chip is disposed in the chip mounting area. The first bumps are bonded to the first inner ends respectively, and the second bumps are bonded to the second inner ends respectively.

Based on the above, in the COF package structure of the invention, by disposing the second upper leads having the second inner ends and the upper pads inside the chip mounting area and dividing the second upper leads into a plurality of groups, in which the upper pads of each of the groups are closely arranged layer by layer or row by row in a direction away from the second inner ends, more upper pads can be disposed within the chip mounting area of a limited size. Further, provided with the first conductive vias for connecting the upper pads and the lower leads correspondingly, the flexible substrate not only has the first upper leads extending outward on the upper surface of the flexible base, but also has the second upper leads in the chip mounting area capable of extending the circuit to the lower surface of the flexible base through the upper pads and the first conductive vias and further extending outward through the lower leads. In such a way, the number of the leads capable of being arranged on the flexible substrate can be significantly increased to cater to the chip having more bumps. Moreover, in the aforementioned arrangement, since the upper pads and the second upper leads are disposed within the chip mounting area without occupying the region outside the chip mounting area of the flexible base, such that the layout of the circuit layer on the flexible base can be more flexible.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
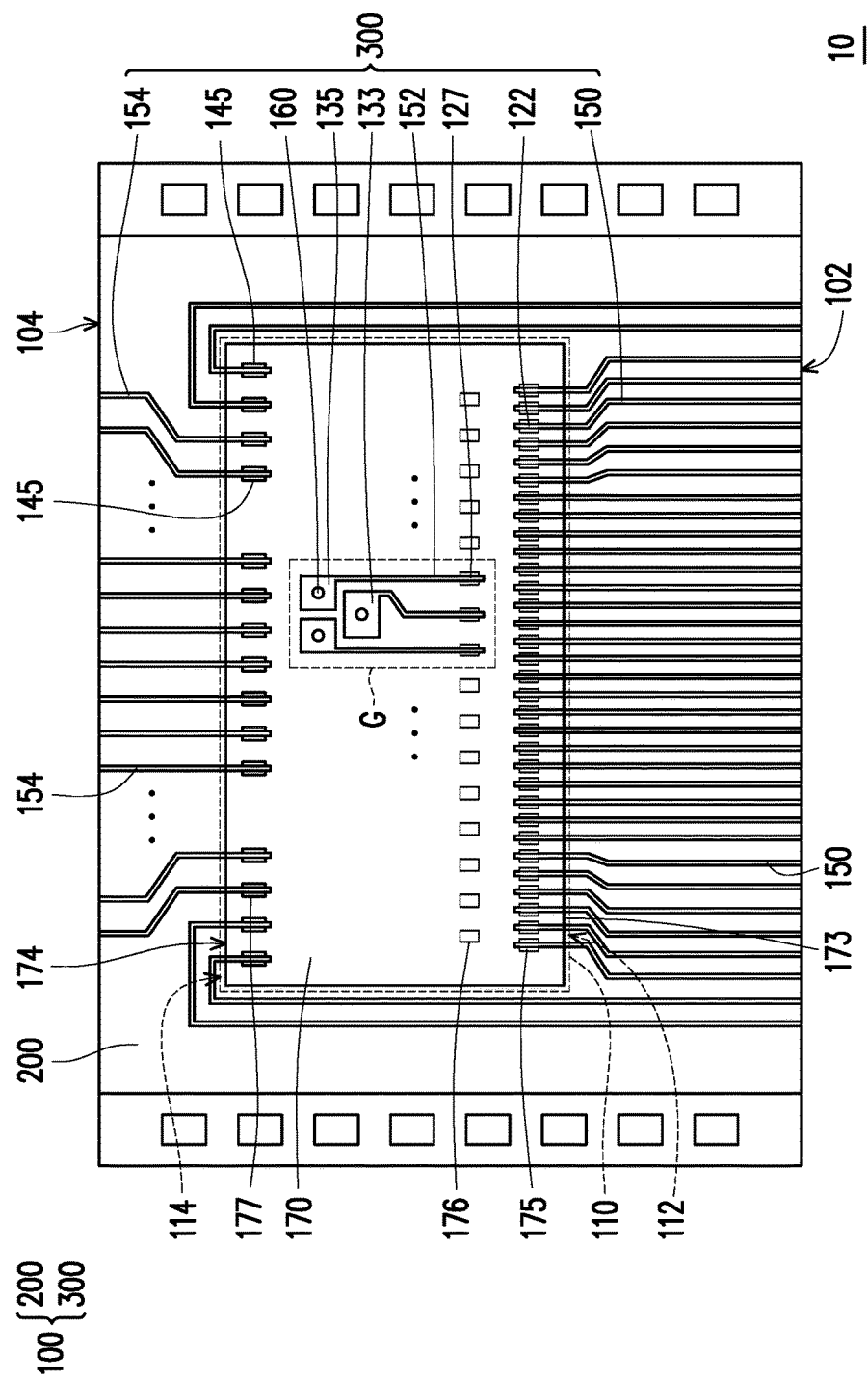
FIG. 1 is a schematic diagram illustrating a chip-on-film (COF) package structure according to an embodiment of the invention.
Figure 2:
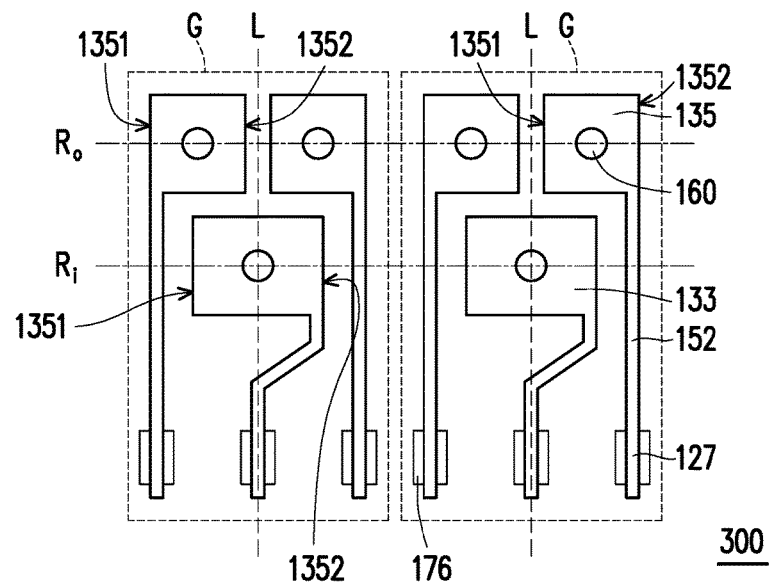
FIG. 2 is a schematic partially enlarged diagram illustrating a circuit layer of the COF package structure illustrated in FIG. 1.
Figure 3:
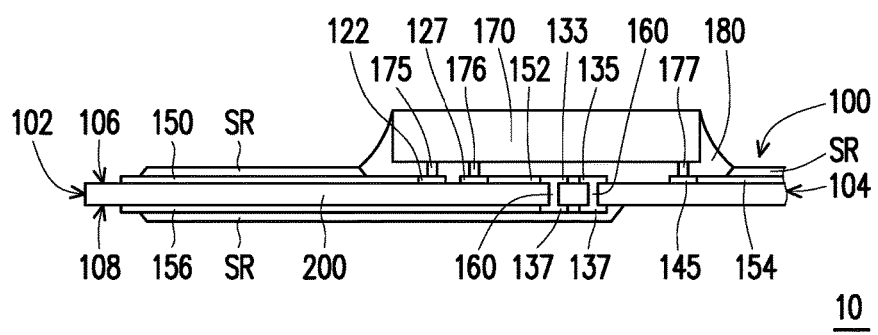
FIG. 3 is a schematic partial cross-sectional diagram illustrating the COF package structure illustrated in FIG. 1.

FIG. 1 is a schematic diagram illustrating a chip-on-film (COF) package structure according to an embodiment of the invention. FIG. 2 is a schematic partially enlarged diagram illustrating a circuit layer of the COF package structure illustrated in FIG. 1. FIG. 3 is a schematic partial cross-sectional diagram illustrating the COF package structure illustrated in FIG. 1. It should be noted that in the COF package structure illustrated in FIG. 1, only one group of the second upper leads is schematically illustrated and enlarged in the chip mounting area for reference, and its actual amount, size and ratio are not approximate to those illustrated in FIG. 1. In the same way, in the schematic partially enlarged diagram of the circuit layer illustrated in FIG. 2, only two groups of the second upper leads are schematically and simply illustrated and enlarged, and the actual amount, size and ratio are not approximate to those illustrated in FIG. 2.

Referring to FIG. 1 first, a COF package structure 10 of the present embodiment includes a flexible substrate 100 and a chip 170. The flexible substrate 100 includes a flexible base 200 and a circuit layer 300. The flexible substrate 100 is a double-sided circuit substrate.

Referring to FIG. 1 and FIG. 3, the flexible base 200 has an upper surface 106 and a lower surface 108 opposite to each other. A chip mounting area 110 is defined on the upper surface 106 of the flexible base 200 and has a first side 112 and a second side 114 opposite to each other. The circuit layer 300 includes a plurality of first upper leads 150, a plurality of second upper leads 152, a plurality of first conductive vias 160, a plurality of third upper leads 154 and a plurality of lower leads 156.

Referring to FIG. 1 and FIG. 3, in the present embodiment, the flexible base 200 has a first end 102 and a second end 104 opposite to each other. The first upper leads 150 are located on the upper surface 106 of the flexible base 200, and each of the first upper leads 150 has a first inner end 122. The first inner ends 122 are located in the chip mounting area 110 and are close to the first side 112. The first inner ends 122 are successively arranged along a direction parallel to the first side 112. Each of the first upper leads 150 extends from the first inner end 122 towards the first end 102 in a direction away from the chip mounting area 110.

The second upper leads 152 are located on the upper surface 106 of the flexible base 200 and entirely disposed within the chip mounting area 110. Each of the second upper leads 152 has a second inner end 127 and an upper pad 133 or 135 opposite to each other. To be specific, the second inner ends 127 are close to the first side 112 and is further away from the first side 112 than the first inner ends 122. The second inner ends 127 are successively arranged along the direction parallel to the first side 112. Each of the second upper leads 152 extends from the second inner end 127 in a direction toward the second side 114 to connect with one of the upper pads 133, 135. The upper pads 133, 35 are correspondingly connected with the first conductive vias 160 respectively. In order to accommodate the sizes of the first conductive vias 160 and ensure good connection between the upper pads 133, 135 and the first conductive vias 160, a width of each of the upper pads 133, 135 is greater than that of the other parts (including the second inner end 127) of the corresponding second upper lead 152. To be more specific, each of the second upper leads 152 extends from the second inner end 127 with a smaller width toward the second side 114 to connect with one of the upper pads 133, 135 with a greater width. If the upper pads 133, 135 with the greater widths are successively arranged in the same way along the direction parallel to the first side 112, the pitches of the second inner ends 127 would increase accordingly. As the length of the first side 112 of the chip mounting area 110 remains unchanged, the amount of the second upper leads 152 that can be laid out would certainly be reduced, which is unfavorable for the increase of the lead quantity and the fine pitch demand. Thus, the upper pads 133, 135 are arranged layer by layer into at least two rows in a direction toward the second side 114.

Referring to FIG. 1 and FIG. 2, in the present embodiment, the second upper leads 152 are divided into a plurality of groups G, and the groups G are successively arranged along the direction parallel to the first side 112. The second upper leads 152 in each of the groups G are substantially separated to the left side and the right side by a reference line L, and the reference line L is close to or overlaps a center line of each of the groups G. The center line in each of the groups G is a line perpendicular to the first side 112 and extends through the center of each of the groups G. To be specific, referring to FIG. 1 first, in the COF package structure 10 illustrated in FIG. 1, only one group G of the second upper leads 152 is illustrated in the chip mounting area 110. In the partially enlarged diagram of the flexible substrate 100 illustrated in FIG. 2, only two groups G of the second upper leads 152 are schematically illustrated. However, the number of the groups G and the number of the second upper leads 152 in each of the groups G are not limited in the invention.

In the present embodiment, the upper pads 133, 135 of the second upper leads 152 in each of the groups G are arranged layer by layer into at least two rows in a direction from positions close to the second inner ends 127 toward the second side 114, and there are upper pads 135 symmetrically arranged on both sides of the reference line L on at least one row furthest from the second inner ends 127. In other words, the upper pads 133, 135 are arranged into at least two rows along the direction perpendicular to the first side 112 and toward the second side 114, and the number of the upper pads 135 on the row which is the furthest from the second inner ends 127 or the first side 112 is at least two. The at least two upper pads 135 are arranged along a direction parallel to the second side 114 and are symmetrically arranged on both sides of the reference line L. In the present embodiment, the reference line L overlaps the center line of each of the groups G.

Referring to FIG. 1 and FIG. 2, in the present embodiment, the upper pads 133, 135 of the second upper leads 152 of each of the groups G are arranged into two rows in a direction away from the second inner ends 127. The upper pads 133 which are closer to the second inner ends 127 are arranged on an innermost row and the upper pads 135 which are the furthest from the second inner ends 127 are arranged on an outermost row $R_o$. However, the number of the rows of the upper pads of the invention is not limited thereto. Actually, the number of the second upper leads 152 and the number of the rows of the upper pads 133, 135 in each of the groups G are optimally arranged according to the total quantity of the second upper leads 152, the size of the available space of the chip mounting area 110 and the acceptable minimum size for the upper pads 133, 135. To be specific, in the present embodiment, the number of the upper pads 133 located on the innermost row $R_i$ in each of the groups G is one, the number of the upper pads 135 located on the outermost row $R_o$ is two, and the two upper pads 135 are symmetrically disposed in a face-to-face manner on both sides of the reference line L. However, the numbers of the upper pads 133, 135 on each row are not limited in the invention.

Referring to FIG. 1, FIG. 2 and FIG. 3, in the present embodiment, the first conductive vias 160 penetrate the flexible base 200 and are located in the chip mounting area 110. To be specific, the first conductive vias 160 are correspondingly connected with the upper pads 133, 135 respectively. Referring to FIG. 3, the lower leads 156 are located on the lower surface 108 of the flexible base 200 and electrically connected with the second upper leads 152 through the first conductive vias 160.

Referring to FIG. 3 continuously, in the present embodiment, each of the lower leads 156 has a lower pad 137, the lower pads 137 are disposed coinciding with the upper pads 133, 135 respectively, and the first conductive vias 160 connect the upper pads 133, 135 and the corresponding lower pads 137 respectively.

In the present embodiment, each lower lead 156 extends outward from one of the lower pads 137. To be specific, the lower leads 156 extend from a region that the chip mounting area 110 projects on the lower surface 108 of the flexible base 200 toward the first end 102. To be more specific, the positions of the lower leads 156 on the lower surface 108 of the flexible base 200 may coincide with the positions of the first upper leads 150 which also extend toward the first end 102 and are located on the upper surface 106 respectively. In this way, the distribution of the metal lines on the upper surface 106 and the lower surface 108 is more consistent, avoiding the poor bonding between the chip 170 and the leads due to an uneven force distribution as well as avoiding the occurrence of warpage to the flexible substrate 100. However, in other embodiments, the lower leads 156 may also extend in a direction toward the second end 104.

Referring to FIG. 1 and FIG. 3 again, in the present embodiment, the chip 170 of the COF package structure 10 has a first edge 173 and a second edge 174 opposite to each other. The chip 170 includes a plurality of first bumps 175 and a plurality of second bumps 176 located on an active surface thereof and close to the first edge 173. The first bumps 175 and the second bumps 176 are respectively arranged in a single-row manner along a direction parallel to the first edge 173, and the second bumps 176 are further away from the first edge 173 than the first bumps 175. The chip 170 is disposed in the chip mounting area 110 in flip-chip manner with the active surface facing the upper surface 106, wherein the first edge 173 corresponds to the first side 112 of the chip mounting area 110, and the second edge 174 corresponds to the second side 114 of the chip mounting area 110. As illustrated in FIG. 3, the first bumps 175 are bonded to the first inner ends 122 respectively, and the second bumps 176 are bonded to the second inner ends 127 respectively. In the present embodiment, the first bumps 175 and the second bumps 176 are output terminals, and the first upper leads 150 and the second upper leads 152 are output side leads.

In the present embodiment, the circuit layer 300 further includes the plurality of third upper leads 154 located on the upper surface 106. Each of the third upper leads 154 has a third inner end 145, and the third inner ends 145 are located in the chip mounting area 110 and close to the second side 114. The third inner ends 145 are successively arranged along the direction parallel to the second side 114. According to FIG. 1, each of the third upper leads 154 extends from the third inner end 145 into the direction away from the chip mounting area 110. To be specific, the third upper leads 154 extend from the third inner ends 145 in a direction toward the second end 104 or the first end 102. As shown in FIG. 3, the chip 170 includes a plurality of third bumps 177 close to the second edge 174. The third bumps 177 are arranged in a single-row manner along a direction parallel to the second edge 174 and are bonded to the third inner ends 145 respectively. In the present embodiment, the third bumps 177 may include input terminals and output terminals, and the third upper leads 154 may include input side leads and output side leads.

Referring to FIG. 2 again, each of the upper pads 133 and 135 in each of the groups G has a first pad side 1351 and a second pad side 1352 opposite to each other and parallel to the reference line L. The second upper leads 152 are correspondingly connected with the first pad sides 1351 or the second pad sides 1352 of the upper pads 135 symmetrically arranged on both sides of the reference line L respectively. To be specific, in the present embodiment, in each of the groups G the second upper leads 152 located on the left side of the reference line L are connected with the first pad sides 1351 of the corresponding upper pads 135, and the second upper leads 152 located on the right side of the reference line L are connected with the second pad sides 1352 of the corresponding upper pads 135, such that the upper pads 135 in each of the groups G and the corresponding second upper leads 152 are arranged in a shape like two mirrored letter P's facing each other. Additionally, in the present embodiment, the second upper leads 152 are also correspondingly connected with the first pad sides 1351 or the second pad sides 1352 of the upper pads 133, but the invention is not limited thereto.

Referring to FIG. 2 still, the upper pads 133, 135 in each of the groups G are located between two of the second upper leads 152 which are the furthest from the reference line L and respectively located on both sides of the reference line L. To be specific, in the present embodiment, the upper pads 133, 135 in each of the groups G are located between the second upper lead 152 connected with the first pad side 1351 of the upper pad 135 on the left side of the reference line L and the second upper lead 152 connected with the second pad side 1352 of the upper pad 135 on the right side of the reference line L. In other words, a layout space of each of the groups G is defined by the two outermost second upper leads 152 located on both sides, while all the upper pads 133, 135 and other second upper leads 152 of each of the groups G are closely arranged layer by layer inside the layout space so as to have the layout space being effectively used.

Referring to FIG. 1 and FIG. 2 again, in the present embodiment, a total area of the upper pads 133, 135 on each row in each of the groups G gradually increases from an innermost row $R_i$ closest to the second inner ends 127 to an outermost row $R_o$ furthest from the second inner ends 127. To be specific, an area of the upper pad 133 on the innermost row $R_i$ is smaller than a total area of the upper pads 135 on the outermost row $R_o$. It can also be said that a width of the upper pad 133 on the innermost row $R_i$ is smaller than a total width of the upper pads 135 on the outermost row $R_o$, while in a top view, the upper pads 133, 135 of each of the groups G are arranged in a shape similar to an inverted triangle.

In this way, the upper pads 133, 135 in the chip mounting area 110 gradually increase in number and/or the total area (or the total width) by rows in the direction away from the second inner ends 127, and are electrically connected with the lower leads 156 located on the lower surface 108 of the flexible base 200 respectively through the corresponding first conductive vias 160. Hence, the upper pads 133, 135 would not occupy the region outside the chip mounting area 110 of the flexible base 200 employed for lead layout, and also would not lead to increased pitches of the second inner ends 127.

Thus, the COF package structure 10 of the present embodiment uses the space inside the chip mounting area 110 to arrange the second upper leads 152, and has the second upper leads 152 on the upper surface 106 connected with the lower leads 156 on the lower surface 108 of the flexible base 200 through the first conductive vias 160, and the upper pads 133 and 135 correspondingly connected with the first conductive vias 160 closely arranged by groups and by layers, so as to effectively increase the number of the leads and reduce the pitches between the leads. Furthermore, by disposing the second upper leads 152 inside the chip mounting area 110, the number of the leads passing through the region outside the chip mounting area 110 may be reduced, leading to greater flexibility in lead design.

It is to be mentioned that in FIG. 1 and FIG. 2, one pattern of the circuit layer 300 is illustrated, but the pattern of the circuit layer 300 is not limited thereto, and other types of circuit layers will be introduced below.

Figure 4:
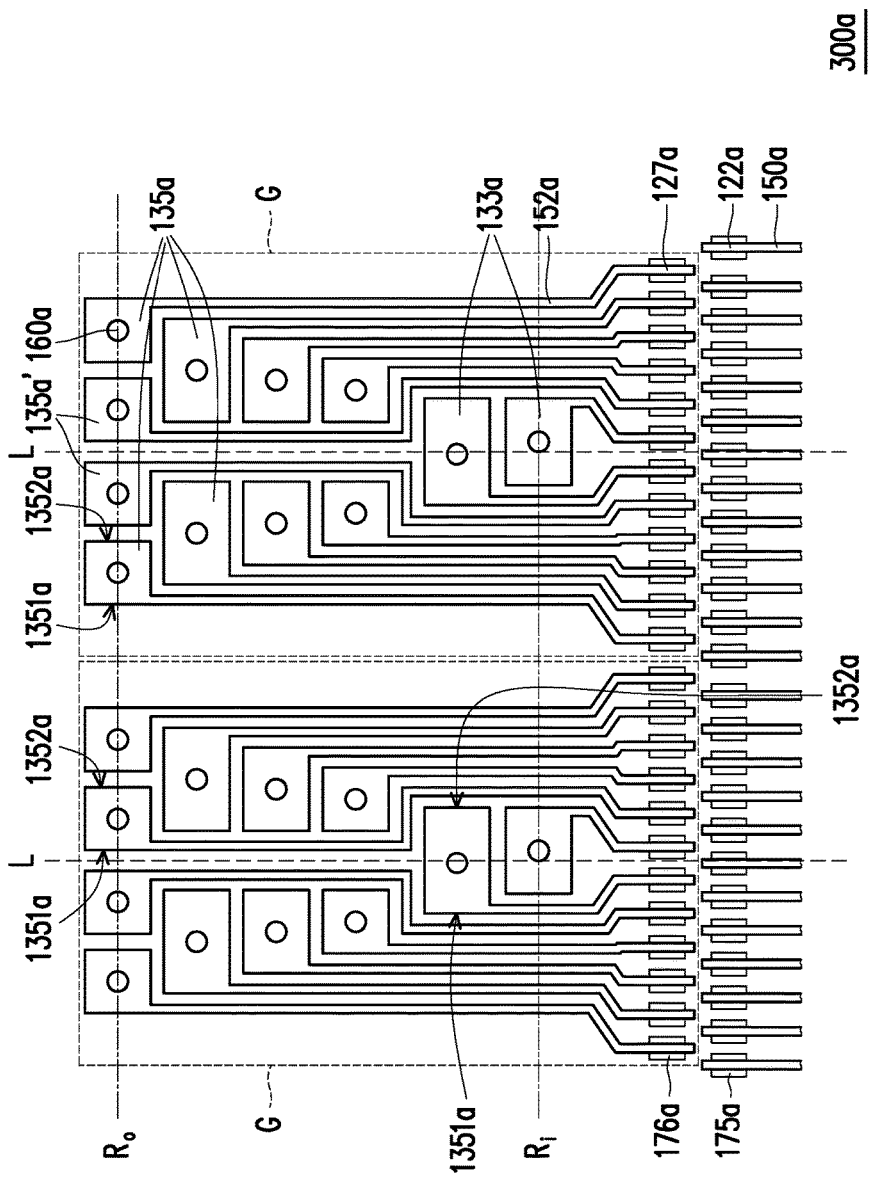
FIG. 4 to FIG. 6 are schematic partially enlarged diagrams illustrating circuit layers of various COF package structures according to other embodiments of the invention.
Figure 5:
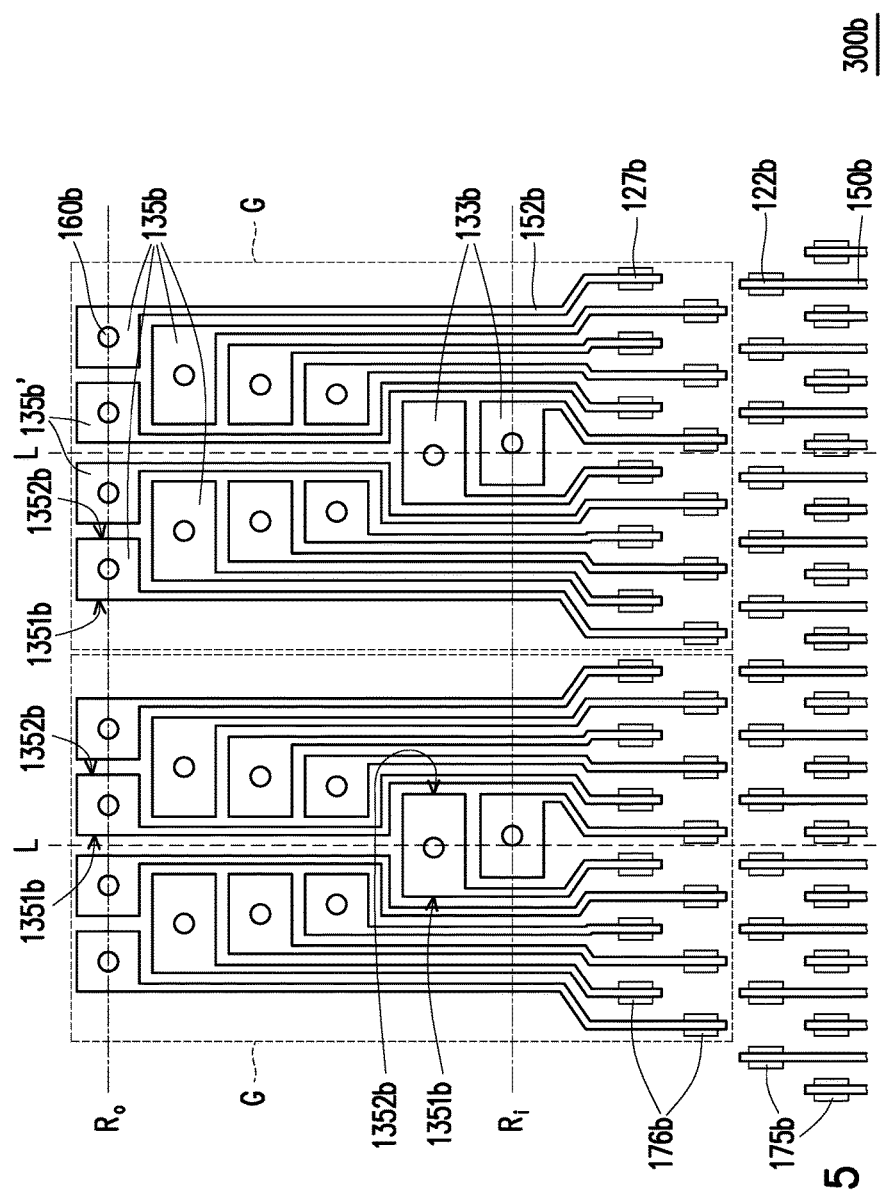
Figure 6:
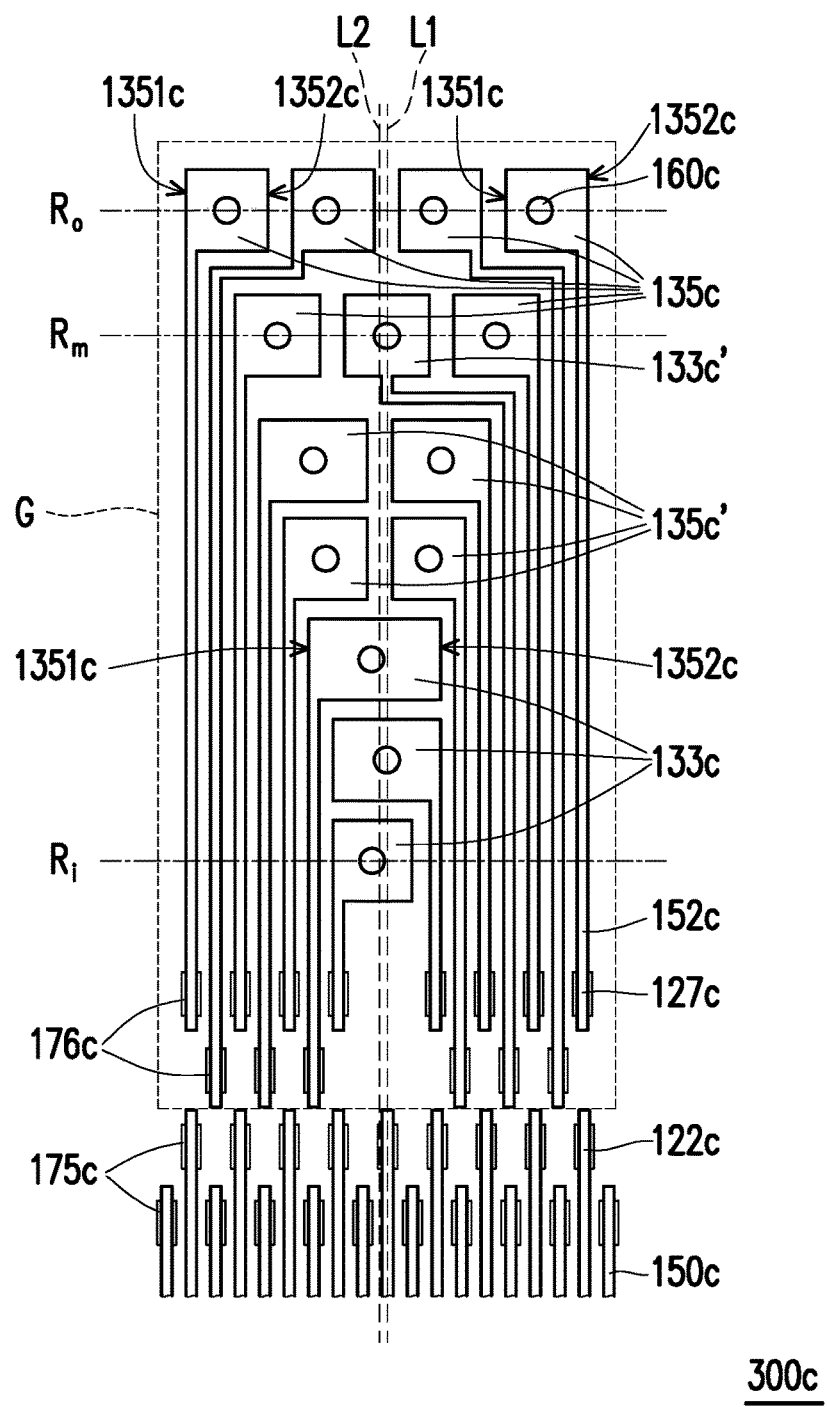

FIG. 4 to FIG. 6 are schematic partially enlarged diagrams illustrating circuit layers of various COF package structures according to other embodiments of the invention. It should be mentioned that FIG. 4 to FIG. 6 illustrate different patterns of circuit layers 300a, 300b and 300c as examples, but construe no limitations to the invention.

Referring to FIG. 4 first, the main difference between the circuit layer 300a of FIG. 4 and the circuit layer 300 of FIG. 2 lies in a plurality of upper pads 133a, 135a, 135a' of each group G of the circuit layer 300a being arranged into more rows. According to FIG. 4, in the present embodiment, the circuit layer 300a has a plurality of second upper leads 152a which are divided into a plurality of groups G (where only two groups G are schematically illustrated in FIG. 4). Each of the second upper leads 152a has a second inner end 127a and one of the upper pad 133a, 135a or 135a'. The upper pads 133a, 135a, 135a' of each of the groups G are arranged layer by layer into a plurality of rows from positions closer to the second inner ends 127a into a direction away from the second inner ends 127a. Closer to the second inner ends 127a, there are at least two rows of the upper pads 133a, each including one upper pad 133a singly and not symmetrically arranged on both sides of the reference line L. In the direction away from the second inner ends 127a, there is a plurality of rows successively disposed and each including the upper pads 135a, 135a' symmetrically arranged on both sides of the reference line L. In the present embodiment, the reference line L overlaps the center line of each of the groups G.

To be specific, the upper pads 133a, 135a, 135a' are located between two of the second upper leads 152a which are the furthest from the reference line L and located on both sides of the reference line L. Each of the upper pads 133a, 135a, 135a' has a first pad side 1351a and a second pad side 1352a opposite to each other and parallel to the reference line L. Each of the second upper leads 152a is connected with one of the pad sides 1351a or 1352a of one of the corresponding upper pad 133a, 135a or 135a'. To be specific, in the present embodiment, the second upper leads 152a located on the left side of the reference line L are connected with the first pad sides 1351a of the corresponding upper pads 135a, and the second upper leads 152a located on the right side of the reference line L are connected with the second pad sides 1352a of the corresponding upper pads 135a, such that the upper pads 135a in each of the groups G are symmetrically arranged on both sides of the reference line L in a face-to-face manner, and the upper pads 135a and the corresponding second upper leads 152a are arranged in a shape like two mirrored letter P's facing each other. In addition, since the outermost row $R_o$ furthest from the second inner ends 127a in each of the groups G has the largest width for disposing the upper pads, in the present embodiment, not only a pair of the upper pads 135a disposed face to face and symmetrically arranged on both sides of the reference line L, but also a pair of the upper pad 135a' symmetrically arranged on both sides of the reference line L are disposed on the outermost row $R_0$ in each of the groups G. Therein, the upper pad 135a' located on the left side of the reference line L connects the corresponding second upper lead 152a with the second pad side 1352a thereof, and the upper pad 135a' located on the right side of the reference line L connects the corresponding second upper lead 152a with the first pad side 1351a thereof, such that the upper pads 135a' in each of the groups G appear to be symmetrically arranged on both sides of the reference line L in a back-to-back manner.

Referring to FIG. 4 again, in the present embodiment, a total area of the upper pads 133a, 135a, 135a' in each row of each of the groups G gradually increases from the innermost row $R_i$ closest to the second inner ends 127a to the outermost row $R_o$ furthest from the second inner ends 127a. Thus, in the top view, the upper pads 133a, 135a, 135a' of each of the groups G are arranged in a shape similar to an inverted triangle.

According to FIG. 4, the first bumps 175a bonded to the first inner ends 122a and the second bumps 176a bonded to the second inner ends 127a are respectively arranged in a single-row manner, but the invention is not limited thereto. Referring to FIG. 5, the main difference between the circuit layer 300b of FIG. 5 and the circuit layer 300a of FIG. 4 lies in that in the present embodiment illustrated in FIG. 5, a plurality of first bumps 175b and a plurality of second bumps 176b are respectively arranged into at least two rows along the direction parallel to the first edge 173 of the chip 170

(referring to FIG. 1). The at least two rows of the second bumps 176b are further away from the first edge 173 than the at least two rows of the first bumps 175b. The adjacent two rows of the first bumps 175b are alternately arranged, and the adjacent two rows of the second bumps 176b are alternately arranged. Accordingly, a plurality of first inner ends 122b of the circuit layer 300b are correspondingly bonded to the first bumps 175b, and a plurality of second inner ends 127b are correspondingly bonded to the second bumps 176b. Thus, the first inner ends 122b and the second inner ends 127b are also respectively arranged into at least two rows along the direction parallel to the first side 112 of the chip mounting area 110 (referring to FIG. 1); the adjacent two rows of the first inner ends 122b are alternately arranged and the adjacent two rows of the second inner ends 127b are alternately arranged. As shown in FIG. 5, by means of the multi-row and alternately arranged bumps and inner ends, the invention can provide finer pitches between the leads, so as to effectively reduce the pitches and increase the number of the leads.

Alternatively, the pattern of the circuit layer may also be as illustrated in FIG. 6. The main difference between the circuit layer 300c of FIG. 6 and the circuit layer 300b of FIG. 5 lies in a plurality of upper pads 133c, 133c', 135c, 135c' of each of the groups G of the circuit layer 300c being arranged into more rows. Additionally, in FIG. 5, a pair of the upper pads 135b symmetrically arranged on both sides of the reference line L in a face-to-face manner and a pair of the upper pads 135b' symmetrically arranged on both sides of the reference line L in a back-to-back manner are disposed on the outermost row $R_o$ furthest from the second inner ends 127b. In FIG. 6, two pairs of upper pads 135c symmetrically arranged on both sides of a reference line L1 in face-to-face manner are disposed on the outermost row $R_o$ in each of the groups G of the circuit layer 300c. That is to say, the second upper leads 152c located on the left side of the reference line L1 are all connected with the first pad sides 1351c of the corresponding upper pads 135c located on the outermost row $R_o$, and the second upper leads 152c located on the right side of the reference line L1 are all connected with the second pad sides 1352c of the corresponding upper pads 135c located on the outermost row $R_o$. Additionally, on the second last row $R_m$, (i.e., the row next to the outermost row $R_0$), there is spare space left after a pair of the upper pads 135c symmetrically arranged on both sides of the reference line L1 are disposed; thus, a single upper pad 133c' may be additionally disposed. The corresponding second upper lead 152c may not connect the first pad side 1351c or the second pad side 1352c of the upper pad 133c', but connect the center of the upper pad 133c'. Further, in FIG. 6, the plurality of rows of the symmetrically arranged upper pads 135c, 135c' may be symmetric with respect to different reference lines L1 and L2. In the present embodiment, the upper pads 135c on the outermost row $R_o$ and the second last row $R_m$ are located on both sides of the reference line L1, wherein the reference line L1 overlaps the center line of each of the groups G. The upper pads 135c' on the third last and the fourth last rows are symmetrically arranged on both sides of the reference line L2, wherein the reference line L2 is close to but slightly deviates from the center line of each of the groups G. However, the number of the different reference lines in each of the groups is not particularly limited in the invention. Those provided above are several types of the circuit layers merely for introduction, but the pattern and the arrangement of the circuit layer are not limited to those described above.

Figure 7:
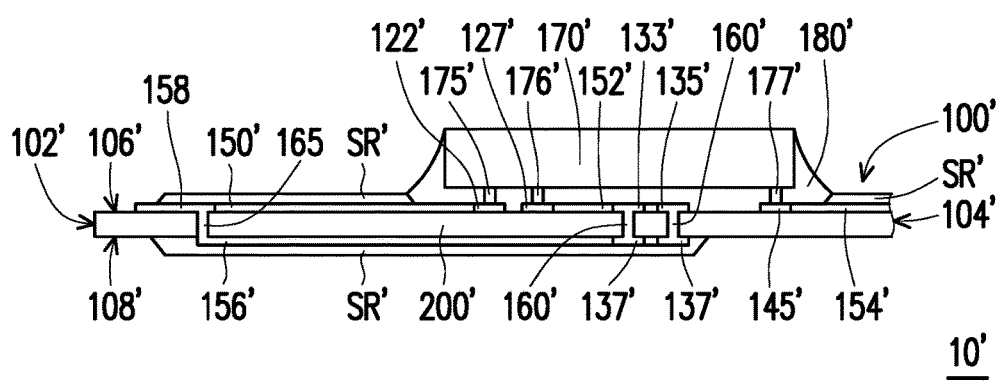
FIG. 7 is a schematic partial cross-sectional diagram illustrating a COF package structure according to another embodiment of the invention.

FIG. 7 is a schematic partial cross-sectional diagram illustrating a COF package structure according to another embodiment of the invention. Referring to FIG. 7, the main difference between a COF package structure 10' of FIG. 7 and the COF package structure 10 of FIG. 1 lies in that in the present embodiment, a circuit layer of the COF package structure 10' further includes a plurality of second conductive vias 165 penetrating a flexible base 200'. The second conductive vias 165 are distant from the chip mounting area 110 (illustrated in FIG. 1) and are correspondingly connected with a plurality of lower leads 156' respectively. In the present embodiment, the second conductive vias 165 are close to a first end 102', the lower leads 156' are directed to an upper surface 106' through the second conductive vias 165 to be connected with external leads 158 disposed on the upper surface 106' for external electrical connection. In such a way, the outer portions of the first upper leads 150' and the second upper leads 152' respectively bonded to the first bumps 175' and the second bumps 176' which serve as external electrical contacts are all located on the same surface (i.e., the upper surface 106'). Thus, the COF package structure 10' can electrically connect an external device (not shown) merely with the upper surface 106', which simplifies the external connection manner. However, positions of the outer connection portions of the leads are not limited in the invention.

Referring to FIG. 1, FIG. 3 and FIG. 7 together, the COF package structure of the invention may further include solder resist layers SR, SR' and encapsulants 180, 180'. The solder resist layers SR, SR' are disposed on the upper surfaces 106, 106' and the lower surfaces 108, 108' and entirely or partially cover the first upper leads 150, 150', the third upper leads 154, 154' and the lower leads 156, 156'. The solder resist layers SR, SR' each has an opening exposing the chip mounting area 110. Namely, the solder resist layers SR, SR' expose the first inner ends 122, 122' and the second upper leads 152, 152'. Additionally, the solder resist layers SR, SR' also expose the outer connection portions of the leads. The encapsulants 180, 180' at least fill between the flexible substrates 100, 100' and the chips 170, 170' respectively to protect the electrical contacts between the circuit layers and the bumps. Furthermore, those provided above are merely some types of the COF package structures, but the bonding manner of the flexible substrate and the chip is not limited to those described above.

In light of the foregoing, in the COF package structure of the invention, by disposing the second upper leads having the second inner ends and the upper pads inside the chip mounting area and dividing the second upper leads into a plurality of groups, in which the upper pads of each of the groups are closely arranged layer by layer or row by row in the direction away from the second inner ends, more upper pads can be disposed within the chip mounting area of a limited size. Further, provided with the first conductive vias for connecting the upper pads and the lower leads correspondingly, the flexible substrate not only has the first upper leads extending outward on the upper surface of the flexible base, but also has the second upper leads in the chip mounting area capable of extending the circuit to the lower surface of the flexible base through the upper pads and the first conductive vias and further extending outward through the lower leads. In such a way, the number of the leads capable of being arranged on the flexible substrate can be significantly increased to cater to the chip having more bumps. Moreover, in the aforementioned arrangement, since the upper pads and the second upper leads are disposed within the chip mounting area without occupying the region outside the chip mounting area of the flexible base, such that the layout of the circuit layer on the flexible base can be more flexible.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A chip-on-film (COF) package structure, comprising:
   a flexible substrate, comprising a flexible base and a circuit layer, the flexible base having an upper surface and a lower surface opposite to each other, wherein a chip mounting area having a first side and a second side opposite to each other is defined on the upper surface, and the circuit layer comprises:
   a plurality of first upper leads, comprising a plurality of first inner ends and located on the upper surface, wherein each of the first upper leads has a first inner end of the first inner ends, the first inner ends are located in the chip mounting area and close to the first side, and each of the first upper leads extends from the first inner end in a direction away from the chip mounting area;
   a plurality of second upper leads, comprising a plurality of second inner ends and a plurality of upper pads, located on the upper surface and disposed in the chip mounting area, wherein
   each of the second upper leads has a second inner end of the second inner ends and an upper pad of the upper pads opposite to each other,
   the second inner ends are close to the first side and located further from the first side than the first inner ends,
   each of the second upper leads extends from the second inner end in a direction toward the second side to connect with the upper pad,
   a width of the upper pad is greater than that of other parts of the corresponding second upper lead, and
   the second upper leads are divided into a plurality of groups, each of the groups has some upper pads of the plurality upper pads of the second upper leads, wherein the upper pads of each of the groups are arranged layer by layer into at least two rows in a direction from positions close to the second inner ends toward the second side, and at least two upper pads of the upper pads symmetrically arranged on both sides of a reference line of each of the groups on at least one row furthest from the second inner ends, wherein the reference line is close to or overlaps a center line of each of the groups;
   a plurality of first conductive vias, penetrating the flexible base, located in the chip mounting area and correspondingly connected with the upper pads of the second upper leads respectively; and
   a plurality of lower leads, located on the lower surface and electrically connected with the second upper leads through the first conductive vias; and
   a chip, having a first edge and a second edge opposite to each other, and comprising a plurality of first bumps and a plurality of second bumps close to the first edge, the chip being disposed in the chip mounting area, wherein the first bumps are bonded to the first inner ends respectively, and the second bumps are bonded to the second inner ends respectively.

2. The COF package structure according to claim 1, wherein the upper pads have a plurality of first pad sides and a plurality of second pad sides, each of the upper pads in each of the groups has a first pad side of the first pad sides and a second pad side of the second pad sides parallel to the reference line and opposite to each other, the second upper leads are correspondingly connected with the first pad sides or the second pad sides of the at least two upper pads symmetrically arranged on both sides of the reference line respectively.

3. The COF package structure according to claim 1, wherein the upper pads in each of the groups are located between two of the second upper leads which are the furthest from the reference line and respectively located on both sides of the reference line.

4. The COF package structure according to claim 1, wherein a total area of the upper pads on each row in each of the groups gradually increases from an innermost row closest to the second inner ends to an outermost row furthest from the second inner ends.

5. The COF package structure according to claim 1, wherein the second bumps are arranged into at least two rows along a direction parallel to the first edge, and the second bumps of the adjacent two rows are alternately arranged.

6. The COF package structure according to claim 1, wherein the circuit layer comprises a plurality of third upper leads comprising a plurality of third inner ends and located on the upper surface, each of the third upper leads has a third inner end of the third inner ends, the third inner ends are located in the chip mounting area and close to the second side, each of the third upper leads extends from the third inner end in a direction away from the chip mounting area, the chip comprises a plurality of third bumps close to the second edge, and the third bumps are bonded to the third inner ends respectively.

7. The COF package structure according to claim 1, wherein the lower leads comprise a plurality of lower pads, each of the lower leads has a lower pad of the lower pads, the lower pads are disposed coinciding with the upper pads respectively, each of the lower leads extends outward from the lower pad, and the first conductive vias connect the upper pads and the corresponding lower pads respectively.

8. The COF package structure according to claim 7, wherein the flexible base has a first end and a second end opposite to each other, and the first upper leads and the lower leads extend to the first end.

9. The COF package structure according to claim 8, wherein the circuit layer comprises a plurality of second conductive vias penetrating the flexible base, and the second conductive vias are distant from the chip mounting area and correspondingly connected with the lower leads respectively.

10. The COF package structure according to claim 7, wherein the lower leads are disposed coinciding with the second upper leads and the first upper leads respectively.

* * * * *